(12) United States Patent
Gravelle

(10) Patent No.: US 9,104,341 B2
(45) Date of Patent: Aug. 11, 2015

(54) VIRTUAL OTP PRE-PROGRAMMING

(71) Applicant: Broadcom Corporation, Irvine, CA (US)

(72) Inventor: Charles Joseph Gravelle, Longmont, CO (US)

(73) Assignee: Broadcom Corporation, Irvine, CA (US)

( * ) Notice: Subject to any disclaimer, the term of this patent is extended or adjusted under 35 U.S.C. 154(b) by 225 days.

(21) Appl. No.: 13/931,015

(22) Filed: Jun. 28, 2013

(65) Prior Publication Data

US 2014/0223078 A1    Aug. 7, 2014

Related U.S. Application Data

(60) Provisional application No. 61/759,470, filed on Feb. 1, 2013, provisional application No. 61/836,889, filed on Jun. 19, 2013.

(51) Int. Cl.
*G06F 3/00* (2006.01)
*G06F 3/06* (2006.01)
*G11C 16/10* (2006.01)
*G06F 12/02* (2006.01)

(52) U.S. Cl.
CPC .......... *G06F 3/0679* (2013.01); *G06F 12/0246* (2013.01); *G11C 16/102* (2013.01)

(58) Field of Classification Search
None
See application file for complete search history.

(56) References Cited

U.S. PATENT DOCUMENTS 5,613,018 A *  3/1997  Eldridge ................ 382/296
8,429,375 B1 *  4/2013  Pollack et al. ............ 711/202

* cited by examiner

*Primary Examiner* — Cheng-Yuan Tseng
*Assistant Examiner* — Craig Goldschmidt
(74) *Attorney, Agent, or Firm* — McDermott Will & Emery LLP

(57) ABSTRACT

Aspects of virtual one-time programmable (OTP) memory pre-programming are described. A device may include a logical sink destination, an OTP memory map, a virtual memory map, and a comparator. The OTP memory map may store one or more OTP logical values, and the virtual memory map may store one or more default virtual logical values. Generally, the virtual memory map may be predefined for various representative OTP scenarios including test and customer-specific values. Certain portions or outputs of the logical values stored in the OTP memory map and the virtual memory map may be compared by the comparator, and the logical result of the comparison may be output to the logical sink destination. In certain aspects, the portions or outputs of OTP and virtual memory maps that are compared may be determined based on various factors such as strap option settings, temperatures, voltages, or register values of the device.

20 Claims, 7 Drawing Sheets

US 9,104,341 B2

VIRTUAL OTP PRE-PROGRAMMING

CROSS-REFERENCE TO RELATED APPLICATIONS

This application claims the benefit of U.S. Provisional Application No. 61/759,470, filed Feb. 1, 2013, and U.S. Provisional Application No. 61/836,889, filed Jun. 19, 2013, the entire contents of each of which are hereby incorporated herein by reference.

BACKGROUND

Many semiconductor devices rely upon one-time programmable memory maps to store various logical values. The logical values may define operating parameters, such as voltage parameters, timing parameters, test modes, and other operating characteristics which impact the operation of the semiconductor. Generally, a one-time programmable memory map may be embodied as one or more fuses or similar elements which may be programmed after manufacture of the semiconductor.

However, a relatively large amount of time may be needed to program the one-time programmable memory map after manufacture of a semiconductor device. This time may impact the overall cost of the semiconductor device. Further, once programmed, the one-time programmable memory map generally cannot be modified. Thus, if a one-time programmable memory map is programmed incorrectly, then the semiconductor device may be rendered useless for its intended purpose.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Figure 1:
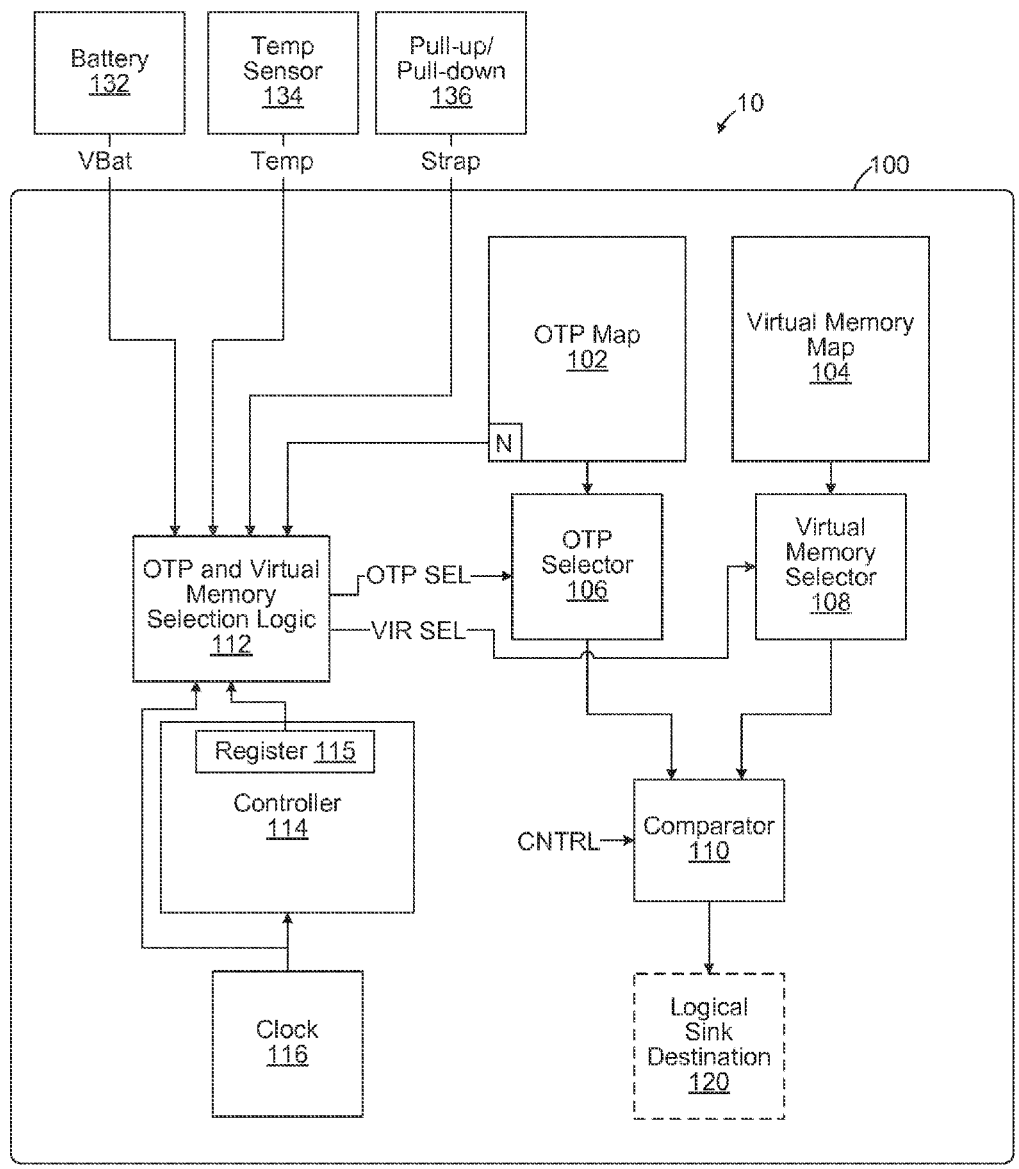
FIG. 1 illustrates a system for virtual OTP pre-programming according to an example embodiment.

Many semiconductor devices rely upon one-time programmable (OTP) memory maps to store various logical values. The logical values may define operating parameters, such as voltage parameters, timing parameters, test modes, and other operating characteristics which impact the operation of the semiconductor. Generally, an OTP map may be embodied as one or more fuses or similar elements which may be programmed after manufacture of the semiconductor. In this sense, the OTP map may be thought of as a type of memory array (e.g., more or less than 512 bits), where each bit in the memory array initially stores a logic value of "0" (or "1") before being programmed. In some cases, each bit in the memory array can be changed only once, and time is required for programming individual bits on each semiconductor device.

Because each bit in an OTP map that is "programmed" requires additional tester time, a savings may be realized by designing devices in such a way that the least number of OTP bits as possible need to be programmed. In some situations, however, this may be difficult to accomplish. For example, new features are often disabled so that tester software can be reused from previous device revisions—even if the new feature is to be enabled by default in the final platform of the device. Additionally, non-standard defaults of multiple bit fields may be problematic. For example, even if a 6-bit OTP field will be defined as 101100 or 101010 with 90% certainty, all the bits are often left un-programmed.

According to aspects of the embodiments described herein, by integrating, associating, or coupling one or more virtually pre-programmed XOR memory maps with an OTP map, the OTP map may appear to other logic devices as if it includes a hybrid of both "0" and "1" logic values in its initial pre-programmed state (rather than a uniform array of all "0" or "1" logic values). Even in this initial hybrid state, each bit value in the OTP map may still be programmed to change logic values. Using this feature in various configurations described herein, programming and/or test time for individual semiconductor devices can be reduced.

Further, with the integration of multiple virtual memory maps, an OTP map may appear to have been programmed in various manners. For example, an initial test of a semiconductor chip may rely upon a virtual memory map "A", an analog test of the semiconductor chip may rely upon a virtual map "B", and a burn-in test of the semiconductor chip may rely upon a virtual map "C". Each of these may be configured and used, in turn. Additionally, sample parts for a first customer may rely upon a virtual map "D", while sample parts for a second customer may rely upon a virtual map "E", etc. Each of these virtual memory maps "A"-"E" may appear to be a unique or respective programmed state of the OTP map array, although no (or only a limited number of) actual programming of OTP bits has actually occurred.

In some cases, devices are discarded after certain test steps due to the fact that OTP map programming cannot be reversed. By using the virtual memory maps in various stages as described herein, however, devices that would otherwise have been discarded may be suitable for use. In other words, by changing or alternating between one virtual memory map and another, one or more bits may appear to have been reversed multiple times although no actual programming of an OTP bit actually occurred.

Each virtual memory map, as described herein, may cover or overlap with an entire OTP map or only a portion of the OTP map, and it should be appreciated that the virtual memory map embodiments described herein may be applied to OTP maps of any size. The virtual memory maps may be overlapping with certain sections or areas of an OTP map. For example, an initial virtual memory map, for testing, may overlap with an entire OTP map, and a secondary virtual memory map, for operating settings of a certain customer, may overlap with only a portion of the OTP map.

According to aspects of the embodiments described herein, a virtual memory map is integrated into a device. That is, using an OTP macro or wrapper, default virtual logical values in a virtual memory map are preset or predefined to most-likely settings. In this way, preset or predefined logical values may be defined by certain couplings to top layers of metal, for example, in the device, and the virtual memory map can be changed in part (or entirely) with only a lower cost metal change.

As described herein, multiple virtual memory maps may be relied upon to emulate different OTP maps for test modes or customer-specific requirements. These virtual memory maps may cover a portion or entirety of an actual OTP map. The OTP map itself may remain un-programmed so that all OTP logical values can still be programmed later if necessary. A XOR or similar logical gate is included for comparing one or more logical output values between the OTP map and the virtual memory map, as needed.

Certain logical output values of the OTP map and the virtual memory map are selected for comparison based on one or a combination of system or device parameters. In one embodiment, the system parameters include a current battery voltage or a strap pin setting, for example. In another embodiment, the device parameters may include other system environment control parameters (i.e., environmental parameters), such as temperature, one or more system voltages or currents, or one or more voltage or current thresholds, for example, or any combination thereof, without limitation. Additionally or alternatively, certain logical output values may be selected based on software control and may change over time, depending upon the application.

The environmental parameters may extend to include feedback from other external elements, such as a light sensor, a global positioning service (GPS) location subsystem, a motion sensor, automotive related sensors, or an altitude or weather sensor, among other elements. In the context of feedback from a GPS subsystem, for example, a device may be configured via a virtual memory map selection to default to United States, European, Japanese, or Chinese standards by the feedback. Further, automotive applications may select between two different virtual memory maps based on the environmental parameter of detected motion, offering different default settings for a stationary vehicle as compared to the same vehicle in motion. In this sense, the selection of a virtual memory map according to environmental parameters encompasses the use of parameters in addition to temperature, voltage, or current parameters of a device.

According to aspects of these features, a device may include a logical sink destination, an OTP memory map, a virtual memory map, and a comparator. The OTP memory map may store one or more OTP logical values, and the virtual memory map may store one or more default virtual logical values. Generally, the virtual memory map may be predefined for various representative OTP scenarios including test and customer-specific values. Certain portions or outputs of the logical values stored in the OTP memory map and the virtual memory map may be compared by the comparator, and the logical result of the comparison may be output to the logical sink destination. In certain aspects, the portions or outputs of OTP and virtual memory maps that are compared may be determined based on various factors such as strap option settings, temperatures, voltages, or register values of the device.

Turning now to the drawings, an introduction and general description of exemplary embodiments of a system is provided, followed by a description of the operation of the same.

FIG. 1 illustrates a system 10 for virtual OTP pre-programming according to an example embodiment. The system 10 includes a device 100 and various elements or subsystems external to the device 100, such as a battery 132, a temperature sensor 134, and a pull-up or pull-down mechanism 136. In various embodiments, the system 10 may include other elements or systems external to the device 100, or the system 10 may exclude one or more of the battery 132, the temperature sensor 134, or the pull-up or pull-down mechanism 136.

The battery 132 may be embodied as any type of battery that supplies electrical power at an output potential voltage VBat. In certain embodiments, the device 100 may convert the potential voltage VBat into a digital value and rely upon the digital value as a logic input to the device 100. Further, the temperature sensor 134 may be embodied as any type of temperature sensor that provides an output Temp signal representative of a temperature. In certain embodiments, the device 100 may convert the output Temp signal into a digital value and rely upon the digital value as a logic input to the device 100. In other embodiments, the temperature sensor 134 may include other sensors or subsystems including pressure or light sensors, for example, or a GPS receiver subsystem.

The pull-up or pull-down mechanism 136 may identify one or more feature options for the device 100. A feature option of the device 100 may be identified based on a voltage strapped to an external pin or pad of the device 100. In other words, for example, a relatively high-impedance resistor may be used to electrically couple a logic-high voltage level to an external pin or pad of the device 100. This logic-high voltage level may be identified by the device 100 to indicate a certain logic input to the device 100. Additionally or alternatively, internal pull-up or pull-down mechanisms or similar selection logic may be relied upon in the device 100 to define one or more feature options.

In the example embodiment of FIG. 1, the device 100 includes an OTP map 132, a virtual memory map 104, an OTP selector 106, a virtual memory selector 108, a comparator 110, an OTP and virtual memory selection logic 112, a controller 114, a clock 116, and a logical sink destination 120. Generally, the OTP map 102 may be embodied as one or more fuses or similar circuit elements which may be programmed after manufacture of the device 100. OTP logical values stored in the OTP map 102 may define operating parameters of the device 100, such as voltage parameters, timing parameters, test modes, and other operating characteristics which impact the operation of the device 100, without limitation. In various embodiments, the OTP map 102 comprises a first OTP memory map that stores one or more first OTP logical values and a second OTP memory map that stores one or more second OTP logical values. As will be appreciated based on the further description below, however, the OTP map 102 may store any number of OTP logical values among embodiments, without limitation, in any arrangement.

The virtual memory map 104 may be embodied as one or more elements representative of predetermined and/or predefined default virtual logical values. The default virtual logical values stored in the virtual memory map 104 may also, in part, define operating parameters of the device 100, as further described below. In various embodiments, the virtual memory map 104 comprises a first virtual memory map that stores one or more first default virtual logical values and a second virtual memory map that stores one or more second default virtual logical values. As will be appreciated based on the further description below, however, the virtual memory map 104 may store any number of default virtual logical values among embodiments, without limitation, in any arrangement.

The OTP selector 106 outputs to the comparator 110 one or more OTP logical values from the OTP map 102. In one embodiment, the OTP selector 106 outputs one or more OTP logical values from the OTP map 102 to the comparator 110 based on an OTP memory selection control parameter OTP SEL, as illustrated in FIG. 1 and further described below. The virtual memory selector 108 outputs to the comparator 110 one or more default virtual logical values from the virtual memory map 104. In one embodiment, the virtual memory selector 108 outputs one or more default virtual logical values from the virtual memory map 104 to the comparator 110 based on a virtual memory selection control parameter VIR SEL, as illustrated in FIG. 1 and further described below.

In one embodiment, the comparator 110 outputs to the logical sink destination 120 at least one of an OTP logical value from the OTP map 102 or a logical result of a comparison between a default virtual logical value from the virtual memory map 104 and an OTP logical value from the OTP map 102. As one example of the comparison performed by the comparator 110, the comparator 110 may perform a logical XOR operation, although other logical operations are within the scope and spirit of the embodiments described herein. In one aspect, the comparator 110 outputs either the OTP logical value from the OTP map 102 or the logical result based upon a control parameter input signal CNTRL as illustrated in FIG. 1.

The OTP and virtual memory map selection logic 112 takes various inputs as illustrated in FIG. 1. For example, the OTP and virtual memory map selection logic 112 takes a voltage input from the battery 132, a temperature input from the temperature sensor 134, a strap option input from the pull-up or pull-down mechanism 136, and one or more OTP logic value inputs from a portion "N" of the OTP map 102. Additionally, the OTP and virtual memory map selection logic 112 may take a clock input from the clock 116 and be coupled to one or more register values in the register 115 of the controller 114. Generally, based upon certain combinatorial logic conditions defined in the selection logic 112, both the OTP memory selection control parameter OTP SEL and the virtual memory selection control parameter VIR SEL are determined by the selection logic 112.

The combinatorial logic conditions defined in the selection logic 112 may direct the OTP SEL and/or VIR SEL control parameters to select various portions of the OTP map 102 and/or the virtual memory map 104 in connection with the OTP selector 106 and/or the virtual memory selector 108. For example, based upon the voltage VBat of the battery 132, the selection logic 112 may define the VIR SEL selection control parameter so that a certain portion of the virtual memory map 104 is selected by the virtual memory selector 108. Similarly, based upon the voltage VBat of the battery 132, the selection logic 112 may define the OTP SEL selection control parameter so that a certain portion of the OTP map 102 is selected by the OTP selector 106. In turn, the portions of the virtual memory map 104 and the OTP map 102 (or the associated logical values stored therein) may be compared by the comparator 110.

As other examples, the selection logic 112 may select certain portions of the OTP map 102 and/or the virtual memory map 104 for comparison by the comparator 110 based on feedback provided by the temperature sensor 134 or the pull-up or pull-down mechanism 136. As noted above, if the temperature feedback provided by the temperature sensor 134 indicates a high temperature, then the selection logic 112 may select a first portion of the virtual memory map 104. On the other hand, if the temperature feedback provided by the temperature sensor 134 indicates a relatively lower temperature, then the selection logic 112 may select a second portion of the virtual memory map 104. Similarly, because the temperature sensor 134 may include other environmental sensors or subsystems, the selection logic 112 may select various portions of the virtual memory map 104 based on other factors as described herein. Also, the selection logic 112 may select various portions of the virtual memory map 104 depending upon the voltage level VBat of the battery 132.

Without limitation, the OTP and virtual memory map selection logic 112 may define the OTP SEL and VIR SEL selection control parameters based on the voltage input from the battery 132, the temperature input from the temperature sensor 134, the strap option input from the external pull-up or pull-down mechanism 136 (or a similar internal pull-up or pull-down mechanism), the one or more OTP logical values from the portion "N" of the OTP map 102, the clock input from the clock 116, the one or more register values in the register 115 of the controller 114, any combination or combinations thereof, or other factors. It is noted that the inputs to the selection logic 112 illustrated in FIG. 1 are not intended to be limiting in nature. Rather, the embodiments described herein may rely upon any suitable input conditions of the selection logic 112.

The controller 114 includes any general purpose processor or processing circuit, without limitation. The register 115 includes any general purpose register of the controller 114, and may include logic values set by the controller 114 from time to time based upon software control, for example. Thus, according to aspects of the embodiments described herein, the OTP SEL and VIR SEL selection control parameters may be based, at least in part, upon software control. Additionally, it should be appreciated that the software control may change over time.

The logical sink destination 120 is coupled to the output of the comparator 110 and is representative of any circuitry that relies upon or makes reference to one or more logical values for conditional operation, without limitation. In this context, the logical sink destination 120 may include any consumer or destination of logic values. For example, the logical sink destination 120 may include circuitry with operating parameters, such as voltage parameters, timing parameters, test modes, and other operating characteristics which may be impacted or defined by logical values output by the comparator 110.

Before turning to the remaining figures, it is noted that conventional devices may directly couple the OTP map 102 to the logical sink destination 120. In contrast, according to aspects and features of the embodiments described herein, one or more default virtual logical values from the virtual memory map 104 may be interposed or interjected for logical comparison with one or more OTP logical values from the OTP map 102, and the result of the logical comparison provided to the logical sink destination 120. In this manner, various default virtual logical values in the virtual memory map 104 may be interjected as virtual replacements for OTP logical values in the OTP map 102, as needed, depending on various factors. For example, before OTP logical values in the OTP map 102 are defined, various default virtual logical values may be interjected for characterization and testing of the device 100, and/or to save production costs and provide flexibility.

Figure 2A:
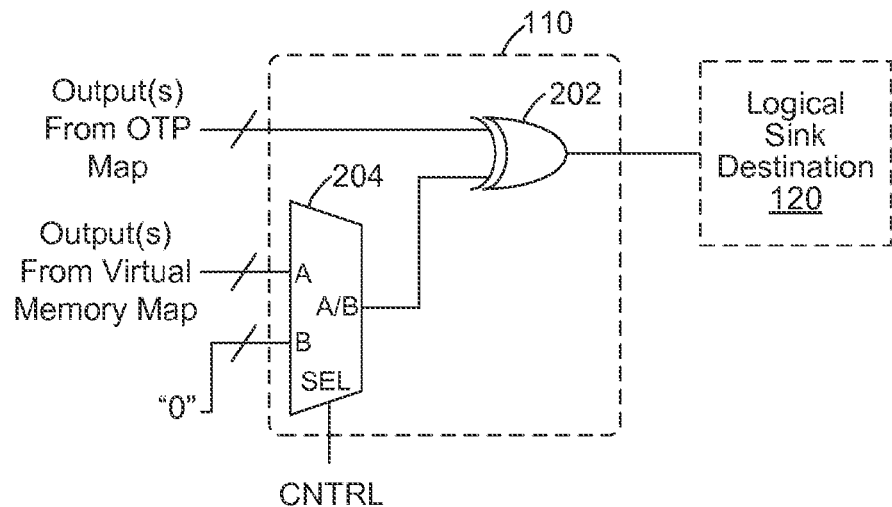
FIG. 2A illustrates a comparator of a device in the system of FIG. 1 according to an example embodiment.

Further aspects and features of the device 100 are described below with reference to FIGS. 2A, 2B, and 3-7. FIG. 2A illustrates the comparator 110 of the device 100 in the system 10 of FIG. 1 according to an example embodiment. In FIG. 2A, the comparator 110 includes an XOR gate 202 and a multiplexer 204. A first input of the XOR gate 202 is coupled to one or more outputs from the OTP map 102, and a second input of the XOR gate 202 is coupled to an output of the multiplexer 204. An output of the XOR gate 202 is coupled to the logical sink destination 120. A first input of the multiplexer 204 is coupled to one or more outputs from the virtual memory map 104, and a second input of the multiplexer 204 is coupled to a logic "0" value. Although not illustrated in FIG. 2A, the one or more outputs from the OTP map 102 and the one or more outputs from the virtual memory map 104 may be provided by way of the OTP selector 106 and the virtual memory selector 108, respectively. Further, although an XOR gate is relied upon in the comparator 110, any other suitable logical function may be relied upon in various embodiments.

In the embodiment of FIG. 2A, the multiplexer 204 outputs either the one or more outputs from the virtual memory map 104 or the logic "0" value based on the control parameter input signal CNTRL. Here, it is noted that, due to the logical function provided by the XOR gate 202, if the multiplexer 204 outputs the logic "0" value, then the comparator 110 will pass the logical values output from the OTP map 102 without modification. Thus, it should be appreciated that the control parameter input signal CNTRL effectively enables or disables virtual OTP pre-programming in the device 100.

Figure 2B:
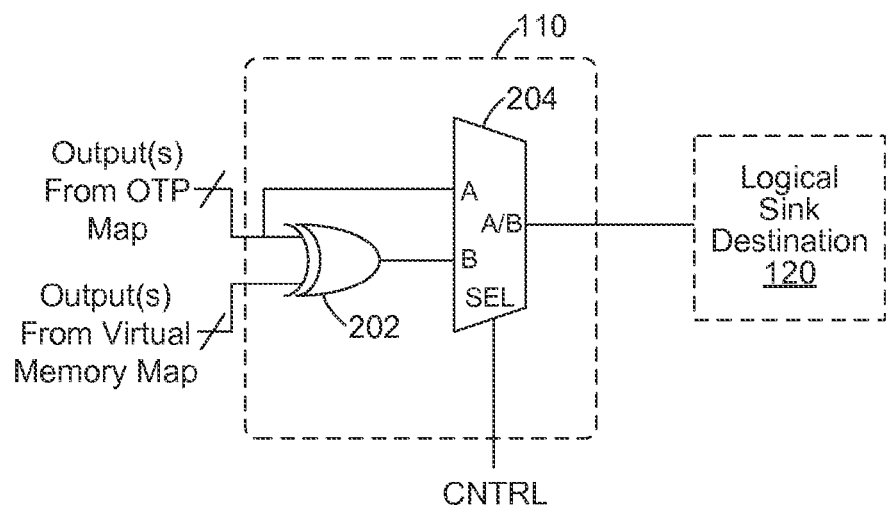
FIG. 2B illustrates another comparator of the device in the system of FIG. 1 according to an example embodiment.

FIG. 2B illustrates another comparator 110 of the device 100 in the system 10 of FIG. 1 according to an example embodiment. In FIG. 2B, the comparator 110 includes the XOR gate 202 and the multiplexer 204. However, the arrangement of the XOR gate 202 and the multiplexer 204 in FIG. 2B differs from that in FIG. 2A. A first input of the XOR gate 202 is coupled to one or more outputs from the OTP map 102, and a second input of the XOR gate 202 is coupled to one or more outputs from the virtual memory map 104. The one or more outputs from the OTP map 102 are coupled to a first input of the multiplexer 204, and an output of the XOR gate 202 is coupled to a second input of the multiplexer 204. An output of the multiplexer 204 is coupled to an input of the logical sink destination 120.

In the embodiment of FIG. 2B, the multiplexer 204 outputs either the one or more outputs from the OTP map 102 or the output from the XOR gate 202 based on the control parameter input signal CNTRL. Here, it is again noted that, if the multiplexer 204 outputs the one or more outputs from the OTP map 102, then the comparator 110 will directly pass the logical values output from the OTP map 102 without modification.

Figure 3:
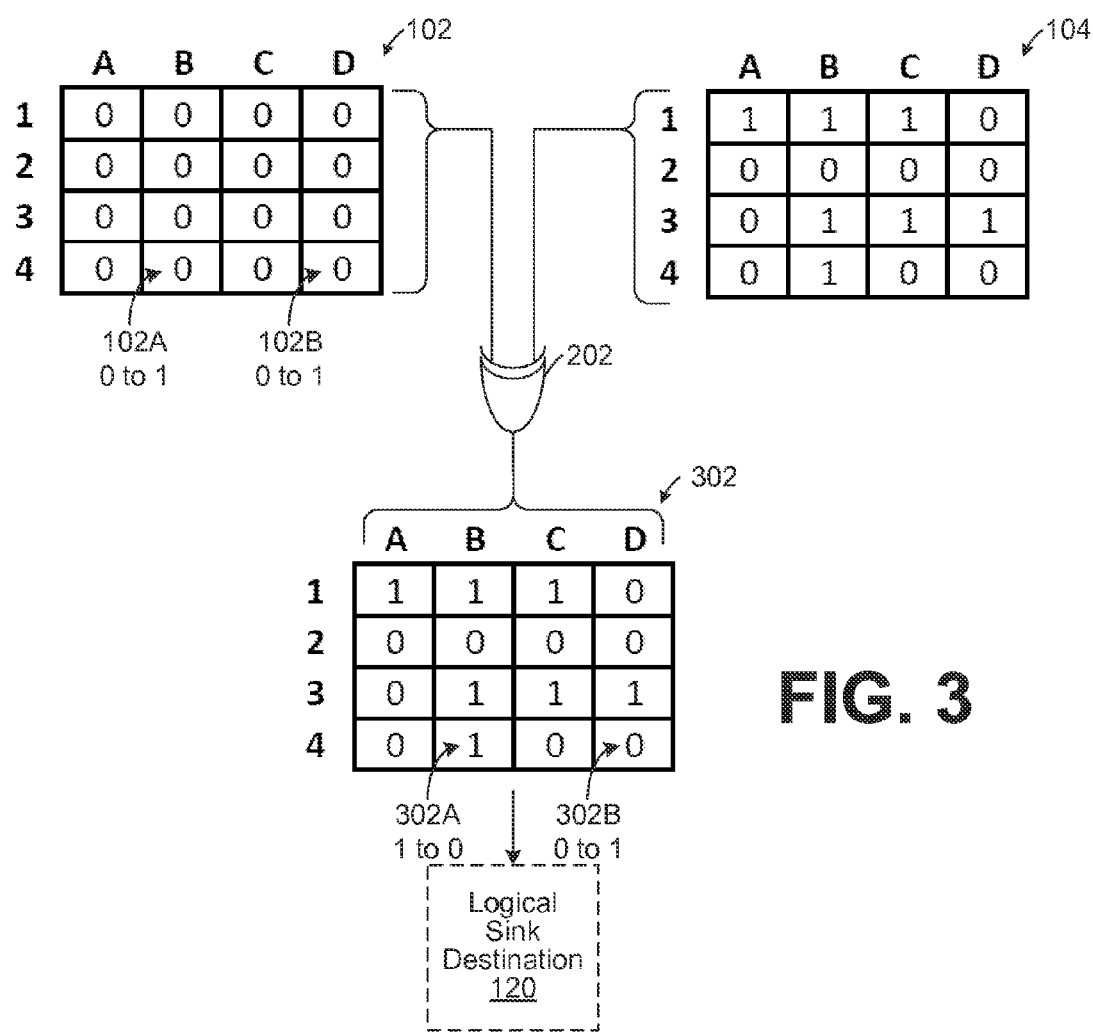
FIG. 3 illustrates a representative comparison between an OTP map and a virtual memory map in the device of FIG. 1 according to an example embodiment.
Figure 4:
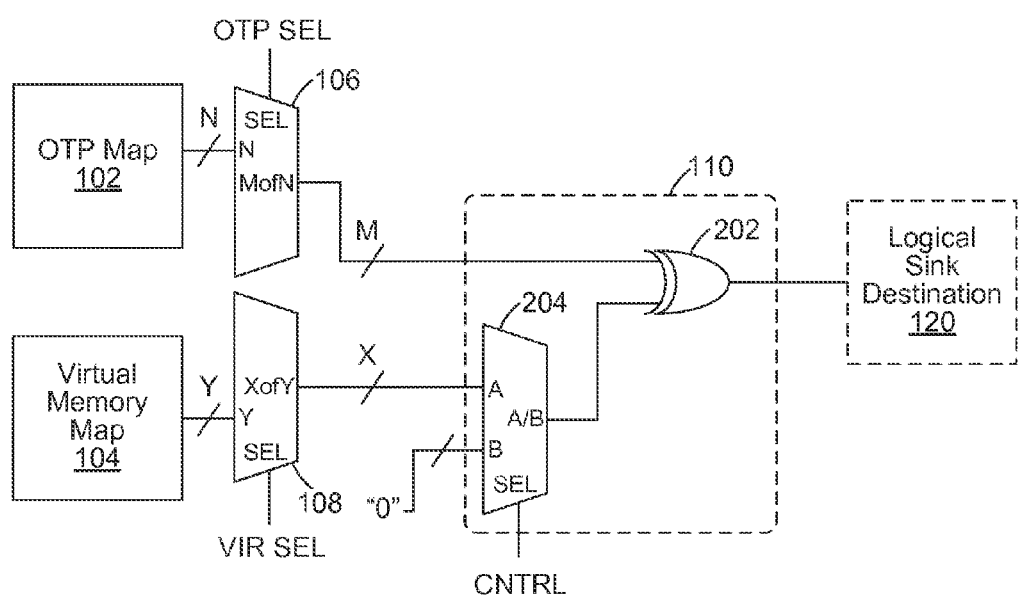
FIG. 4 illustrates a comparator, an OTP selector, and a virtual memory map selector of the device in the system of FIG. 1 according to an example embodiment.

To further illustrate the principles of the embodiments described herein, FIG. 3 illustrates a representative comparison between the OTP map 102 and the virtual memory map 104 in the device 100 of FIG. 1 according to an example embodiment. As illustrated in FIG. 3, OTP logical values from the OTP map 102 are compared with default virtual logical values from the virtual memory map 104 by the XOR gate 202. The logical result output from the XOR gate 202 is provided as the logical result map 302, and is provided to the logical sink destination 120.

In FIG. 3, no OTP logical values are programmed to the OTP map 102. Thus, the logical values of the logical result map 302 mirror those in the virtual memory map 104. In this case, if the logical values in the virtual memory map 104 are suitable, it may not be necessary to program any logical values in the OTP map 102. In this context, the default virtual logical values in the virtual memory map 104 may be predetermined or selected for a "best fit" depending upon the application.

Even if one or more default virtual logical values in the virtual memory map 104 are not suitable, those values may be updated by programming corresponding OTP logical values and the OTP map 102. For example, if the logical result values are 302A and 302B are not suitable, then the corresponding OTP logical values 102A and 102B may be programmed to "1". In turn, based on the logical operation performed by the XOR gate 202, this will cause the logical result value 302A to change from "1" to "0", and will cause the logical result value 302B to change from "0" to "1". Thus, rather than programming OTP logic values for the entire OTP map 102, it may only be necessary to program logical values for the OTP logical values 102A and 102B. In this manner, time and cost may be saved.

Here, it is noted that the logical values in the virtual memory map 104 may be defined in the device 100 according to a relatively simple change in a metal layer, for example, in the device 100. Such a relatively simple change may not require extensive testing for verification. Additionally, the logical values in the virtual memory map 100 may be defined in one or more suitable Hardware Description Level (HDL) macro files, such Verilog or Register Transfer Level (RTL) macro files, among others. Using one or more such macro files, several different virtual memory maps may be maintained for various modes of test and/or customer specifications. Additionally, these macro files may be relatively simple to update and maintain. In certain aspects, the virtual memory map 104 may be defined according to a macro file generated based on a script that automatically generates the macro file, with reference to a type of graphical user interface. For example, the default virtual logic values in a virtual memory map 104 may be outlined in a spreadsheet, and a script may be relied upon to automatically generate an RTL macro file that defines a metal layer in the device 100 to implement the default virtual logic values in the virtual memory map 104.

Figure 5:
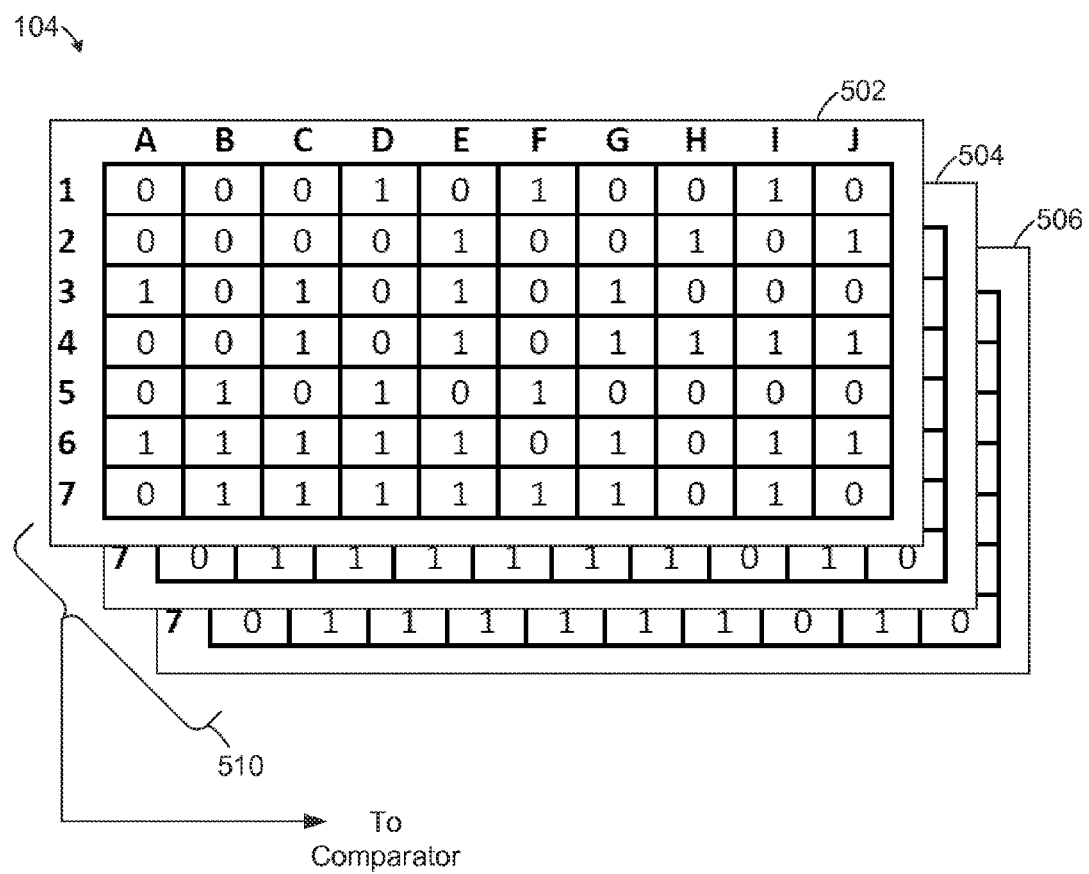
FIG. 5 illustrates a representative selection among virtual memory maps in the device of FIG. 1 according to an example embodiment.

FIG. 5 illustrates a representative selection 510 among virtual memory maps in the device 100 of FIG. 1 according to an example embodiment. In FIG. 5, a plurality of virtual memory maps 502, 504, and 506 are illustrated. According to aspects of the embodiments described herein, any one of the virtual memory maps 502, 504, or 506 may be selected for input to the comparator 110 in the device 100 of FIG. 1. More particularly, the virtual memory map 104 may include each of the virtual memory maps 502, 504, and 506, and any one of the virtual memory maps 502, 504, or 506 may be selected by the virtual memory selector 108 based on the selection control parameter VIR SEL. In this context, the representative selection 510 may be made by the virtual memory selector 108 (FIG. 1) according to the generation of the selection control parameter VIR SEL, as determined by the OTP and virtual memory map selection logic 112.

Figure 6:
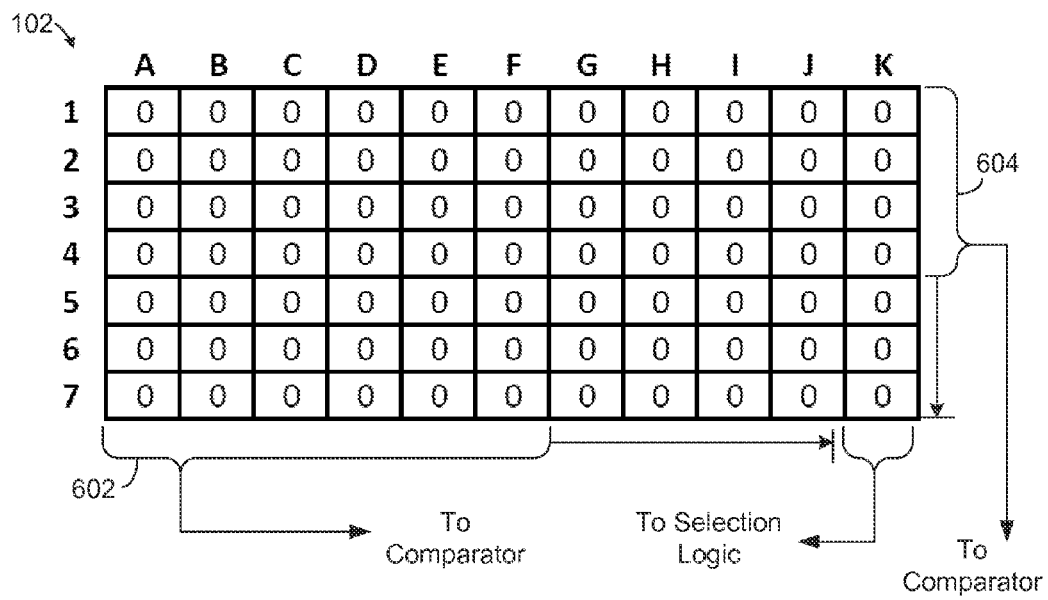
FIG. 6 illustrates representative selections of portions of the OTP memory map in the device of FIG. 1 according to an example embodiment.

FIG. 6 illustrates representative selections 602 and/or 604 of portions of the OTP memory map 102 in the device 100 of FIG. 1 according to an example embodiment. The selections 602 and/or 604 of portions of the OTP memory map 102 may be selected by the OTP selector 106 based on the selection control parameter OTP SEL. In this context, the representative selections 602 and/or 604 may include one or more of the columns A-J or the rows 1-7 of the OTP map 102, without limitation. Generally, any portion of the OTP memory map 102 may be selected by the representative selections 602 and/or 604, among embodiments. In FIG. 6, it is noted that the column K includes the OTP logical value portion "N" of the OTP map 102, which may be relied upon by the OTP and virtual memory map selection logic 112 as a logic input. The representative selections 602 and/or 604 may be made by the OTP selector 106 (FIG. 1) according to the generation of the selection control parameter OTP SEL, as determined by the OTP and virtual memory map selection logic 112.

Figure 7:
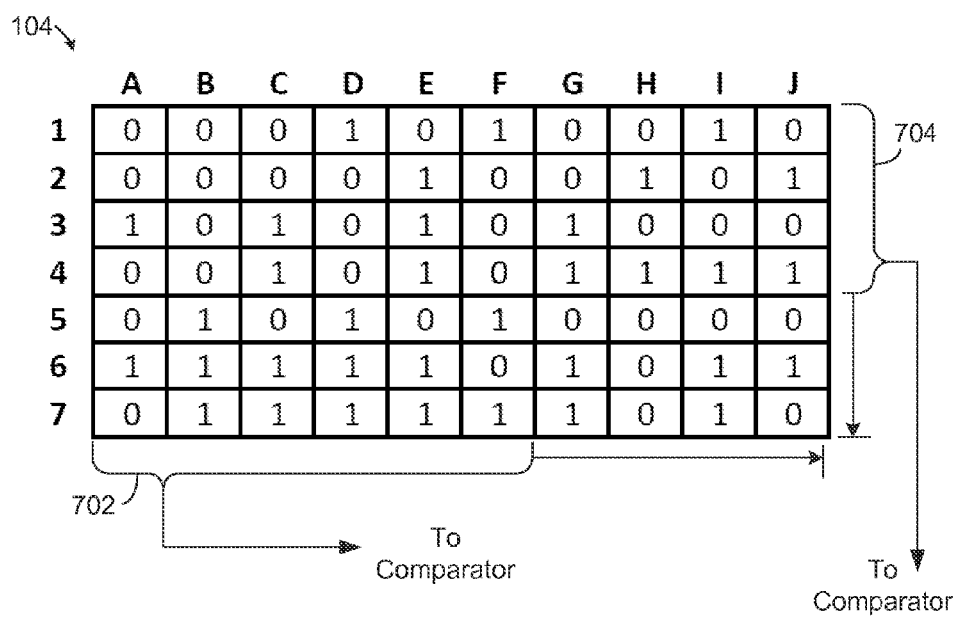
FIG. 7 illustrates representative selections of portions of the virtual memory map in the device of FIG. 1 according to an example embodiment.

FIG. 7 illustrates representative selections 702 and/or 704 of portions of the virtual memory map 104 in the device 100 of FIG. 1 according to an example embodiment. The selections 702 and/or 704 of portions of the virtual memory map 104 may be selected by the virtual memory selector 108 based on the selection control parameter VIR SEL. In this context, the representative selections 702 and/or 704 may include one or more of the columns A-J or the rows 1-7 of the virtual memory map 104, without limitation. Generally, any portion of the virtual memory map 104 may be selected by the representative selections 702 and/or 704, among embodiments. The representative selections 702 and/or 704 may be made by the virtual memory map selector 108 (FIG. 1) according to the generation of the selection control parameter VIR SEL, as determined by the OTP and virtual memory map selection logic 112.

Figure 8:
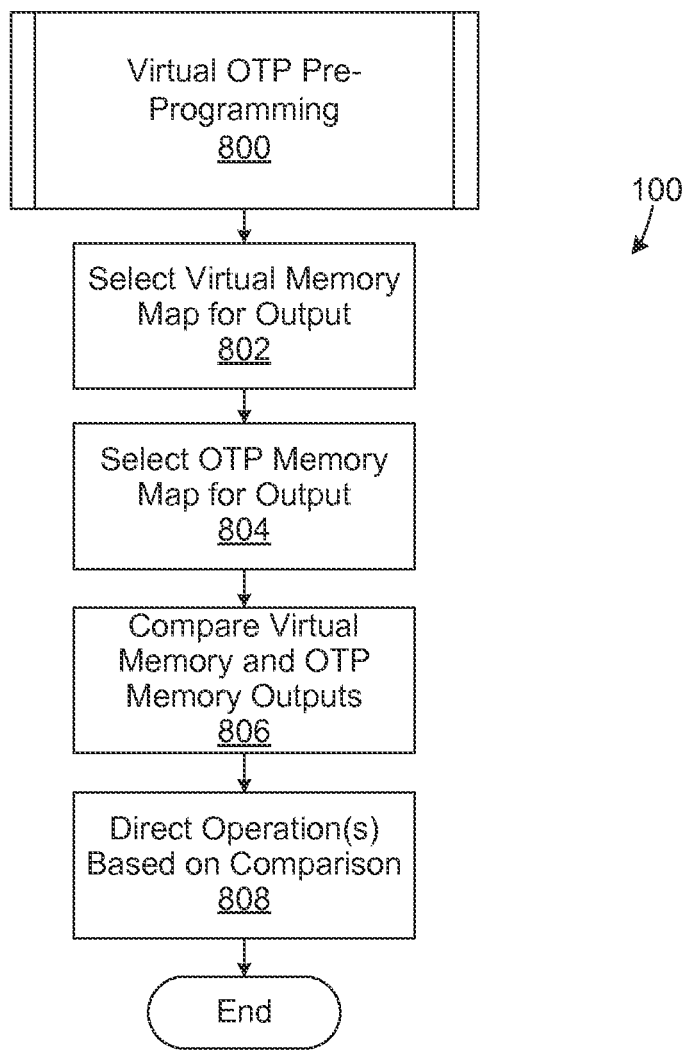
FIG. 8 illustrates a process flow diagram for a process of virtual OTP pre-programming performed by the device of FIG. 1 according to an example embodiment.

Turning to FIG. 8, a process flow diagram illustrating example processes performed by a system for virtual OTP pre-programming is provided. While the process flow diagram is described in connection with the system 10 of FIG. 1, it is noted that other systems may perform the illustrated processes. That is, in various embodiments, systems and devices similar to the device 100 and the system 10 may perform the processes illustrated in FIG. 8.

In certain aspects, the flowcharts of FIG. 8 may be considered to depict example steps performed by the device 100 according to one or more embodiments. Although the process diagram of FIG. 8 illustrates an order, it is understood that the order may differ from that which is depicted. For example, an order of two or more elements in the process may be scrambled relative to that shown, performed concurrently, or performed with partial concurrence. Further, in some embodiments, one or more of the elements may be skipped or omitted within the scope and spirit of the embodiments described herein.

FIG. 8 illustrates a process flow diagram for a process 800 of virtual OTP pre-programming performed by the device 100 of FIG. 1 according to an example embodiment. Beginning at reference numeral 802, the process 800 includes selecting a portion of a virtual memory map for output. For example, as described above in connection with FIG. 1, the virtual memory map selector 108 may select a portion of the virtual memory map 104 based upon the VIR SEL selection control parameter determined or generated by the OTP and virtual memory map selection logic 112. In certain embodiments, the virtual memory map may store a plurality of default virtual logical values for selection at reference numeral 802. As described above, the plurality of default virtual logical values may include at least a default logical test value and a default logical customer value. Any test values may be generally relied upon for setting testing parameters for operations of the device 100, and any customer values may be generally relied upon for setting customer-specific parameters for operations of the device 100. The selection at reference numeral 802 may take place as the device 100 initially powers on, or at any other time.

Continuing to reference numeral 804, the process 800 includes selecting a portion of an OTP map for output. For example, as described above in connection with FIG. 1, the OTP selector 106 may select a portion of the OTP map 102 based upon the OTP SEL selection control parameter determined or generated by the OTP and virtual memory map selection logic 112. In certain embodiments, the virtual memory map may store a plurality of default virtual logical values for comparison. In certain embodiments, the OTP memory map stores a plurality of OTP logical values for selection at reference numeral 804. The selection at reference numeral 804 may take place as the device 100 initially powers on, or at any other time.

At reference numeral 806, the process 800 includes logically comparing the portion of the virtual memory map and the portion of the OTP map. For example, as described above in connection with FIG. 1, the comparison may be performed by the comparator 110, and the comparator 110 may provide a logical result as an output. Further, in some embodiments, the comparison may be based upon one or more control signals, such as the control parameter input signal CNTRL. Further, at reference numeral 808, the process 800 includes directing one or more conditional aspects of operations of a device based on the comparison at reference numeral 806. That is, one or more conditional aspects of operations of the logical sink destination 120, for example, may be directed based on a logical result provided by the comparator 110.

It is noted that the process 800 may be embodied as an iterative process. In other words, after reference numeral 808, the process 800 may further include selections at reference numerals 802 and/or 804, and the comparison at reference numeral 806 may be updated accordingly. Thus, the process 800 may continue over time and in various stages of operation of the device 100.

For example, by selecting various virtual memory maps and OTP maps (or different portions thereof) over time, the resulting XOR'ed combination of the OTP map may appear to have been programmed differently over time. At first, an initial test of a semiconductor chip may rely upon a virtual memory map "A", while a later test may rely upon a virtual map "B". After testing, the chip may be configured for a first customer using a virtual map "D", while other similar chips for a second customer may configured by using a virtual map "E", etc. The configuration or selection of different virtual memory maps and OTP maps permits flexibility which may not otherwise be available.

With further regard to structural aspects of the system 10, the device 100 may comprise combinatorial logic, one or more general purpose arithmetic processors, state machines, and/or Application Specific Integrated Circuits ("ASICs"), for example. Each processor or processing circuit in the device 100 may be configured to execute one or more computer-readable software instruction modules. In certain embodiments, each processor or processing circuit may comprise a state machine or ASIC, and the processes described in FIG. 8 may be implemented or executed by the state machine or ASIC according to the computer-readable instructions. In other embodiments, the processes described in FIG. 8 may be implemented by one or more circuits including combinatorial logic and/or state machines.

The memories and/or registers described herein may comprise any suitable memory devices that store computer-readable instructions to be executed by processors or processing circuits. These memories and/or registers store computer-readable instructions thereon that, when executed by the processors or processing circuits, direct the processors or processing circuits to execute various aspects of the embodiments described herein.

As a non-limiting example group, the memories and/or registers may include one or more of an optical disc, a magnetic disc, a semiconductor memory (i.e., a semiconductor, floating gate, or similar flash based memory), a magnetic tape memory, a removable memory, combinations thereof, or any other known memory means for storing computer-readable instructions.

In certain aspects, the processors or processing circuits are configured to retrieve computer-readable instructions and/or data stored on the memories and/or registers for execution. The processors or processing circuits are further configured to execute the computer-readable instructions to implement various aspects and features of the embodiments described herein.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

At least the following is claimed:

1. A device, comprising:
   a logical sink destination;
   a one-time programmable (OTP) memory map configured to store an OTP logical value;
   a virtual memory map configured to store a default virtual logical value; and
   a comparator configured to output the OTP logical value to the logical sink destination when a control parameter comprises a first value and to output a logical result of a comparison between the default virtual logical value and the OTP logical value to the logical sink destination when the control parameter comprises a second value.

2. The device according to claim 1, wherein the virtual memory map comprises a first virtual memory map configured to store a first default virtual logical value and a second virtual memory map that stores a second default virtual logical value.

3. The device according to claim 2, wherein the first default virtual logical value comprises a test value and the second default virtual logical value comprises a customer-specific value.

4. The device according to claim 2, further comprising a virtual memory map selector configured to output to the comparator, based on a virtual memory selection control parameter, outputs to the comparator one of a first default virtual memory value or a second default virtual memory value.

5. The device according to claim 4, wherein the virtual memory map selector is configured to select a portion of the virtual memory map to output to the comparator based on the virtual memory selection control parameter.

6. The device according to claim 4, wherein the virtual memory selection control parameter is determined according to at least one of a strap option setting, a temperature, a voltage, or a register value.

7. The device according to claim 1, wherein the OTP memory map comprises a first OTP memory map that stores a first OTP logical value and a second OTP memory map that stores a second OTP logical value.

8. The device according to claim 7, further comprising an OTP memory map selector configured to output to the comparator, based on an OTP memory selection control parameter, one of the first OTP logical value or the second OTP logical value.

9. The device according to claim 8, wherein the OTP memory map selector is configured to select a portion of the OTP memory map to output to the comparator based on the OTP memory selection control parameter.

10. A method, comprising:
    selecting, based on a virtual memory selection control parameter, a portion of a virtual memory map for output;
    selecting, based on a one-time programmable (OTP) selection control parameter, a portion of an OTP map for output; and
    outputting the portion of the OTP map when a control parameter comprises a first value, and outputting a logical result of a comparison of the portion of the virtual memory map and the portion of the OTP map when the control parameter comprises a second value.

11. The method of claim 10, wherein the virtual memory map stores a plurality of default virtual logical values.

12. The method of claim 11, wherein the plurality of default virtual logical values comprise at least a default logical test value and a default logical customer value.

13. The method of claim 10, wherein the OTP map stores a plurality of OTP logical values.

14. The method of claim 10, wherein the selecting the portion of the virtual memory map for output comprises selecting the portion of the virtual memory map for output based on at least one of a strap option setting, a temperature, a voltage, or a register value.

15. A device, comprising:
    a one-time programmable (OTP) memory map configured to store a plurality of OTP logical values;
    a virtual memory map configured to store a plurality of default virtual logical values; and
    a comparator configured to output a portion of the plurality of OTP logical values when a control parameter comprises a first value, and to output er-a logical result of a comparison between at least a portion of the plurality of default virtual logical values and a portion of the plurality of OTP logical values when the control parameter comprises a second value.

16. The device according to claim 15, further comprising a virtual memory map selector that, based on a virtual memory selection control parameter, outputs to the comparator the portion of the plurality of default virtual logical values.

17. The device according to claim 16, wherein the virtual memory map selector selects a portion of the virtual memory map to output to the comparator based on the virtual memory selection control parameter.

18. The device according to claim 16, wherein the virtual memory selection control parameter is determined according to at least one of a strap option setting, a temperature, a voltage, or a register value.

19. The device according to claim 15, further comprising an OTP memory map selector that, based on an OTP memory selection control parameter, outputs to the comparator the portion of the plurality of OTP logical values.

20. The device according to claim 19, wherein the OTP memory map selector selects a portion of the OTP memory map to output to the comparator based on the OTP memory selection control parameter.

* * * * *